US010192838B2

(12) United States Patent
Chuang et al.

(10) Patent No.: US 10,192,838 B2
(45) Date of Patent: Jan. 29, 2019

(54) FABRICATION METHOD OF PACKAGING SUBSTRATE

(71) Applicant: Siliconware Precision Industries Co., Ltd., Taichung (TW)

(72) Inventors: Chien-Lung Chuang, Taichung (TW); Po-Yi Wu, Taichung (TW); Meng-Tsung Lee, Taichung (TW); Yih-Jenn Jiang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/411,204

(22) Filed: Jan. 20, 2017

(65) Prior Publication Data

US 2017/0133337 A1 May 11, 2017

Related U.S. Application Data

(62) Division of application No. 13/482,313, filed on May 29, 2012.

(30) Foreign Application Priority Data

Nov. 4, 2011 (TW) ................................ 100140252

(51) Int. Cl.
*H01L 21/44* (2006.01)
*H01L 23/00* (2006.01)
*H01L 23/31* (2006.01)

(52) U.S. Cl.
CPC .......... *H01L 24/11* (2013.01); *H01L 23/3157* (2013.01); *H01L 24/13* (2013.01); *H01L 2224/024* (2013.01); *H01L 2224/0231* (2013.01); *H01L 2224/0239* (2013.01); *H01L 2224/02126* (2013.01); *H01L 2224/03* (2013.01); *H01L 2224/034* (2013.01); *H01L 2224/0361* (2013.01); *H01L 2224/03614* (2013.01); *H01L 2224/03622* (2013.01); *H01L 2224/03912* (2013.01); *H01L 2224/0401* (2013.01); *H01L 2224/05* (2013.01); *H01L 2224/05018* (2013.01); *H01L 2224/05027* (2013.01); *H01L 2224/05082* (2013.01); *H01L 2224/05147* (2013.01); *H01L 2224/05166* (2013.01); *H01L 2224/05558* (2013.01);

(Continued)

(58) Field of Classification Search
CPC ....... H01L 2224/45147; H01L 2224/83; H01L 23/3157
See application file for complete search history.

(56) References Cited

U.S. PATENT DOCUMENTS 5,937,320 A 8/1999 Andricacos et al.
6,323,542 B1 11/2001 Hashimoto (Continued)

*Primary Examiner* — Samuel Gebremariam
(74) *Attorney, Agent, or Firm* — Mintz Levin Cohn Ferris Glovsky and Popeo, P.C.; Peter F. Corless; Steven M. Jensen

(57) ABSTRACT

A packaging substrate includes a base body having at least a conductive pad on a surface thereof, a dielectric layer formed on the surface of the base body and having at least a first opening for exposing the conductive pad and at least a second opening formed at a periphery of the first opening, and a metal layer formed on the conductive pad and the dielectric layer and extending to a sidewall of the second opening, thereby effectively eliminating side-etching of the metal layer under a solder bump.

9 Claims, 4 Drawing Sheets

25
23'
23b
23a
212
21b
21a
21
201
202
20
W1
W3
W3
W2
211
210

(52) U.S. Cl.
CPC ............... *H01L 2224/05562* (2013.01); *H01L 2224/05569* (2013.01); *H01L 2224/05572* (2013.01); *H01L 2224/05582* (2013.01); *H01L 2224/05647* (2013.01); *H01L 2224/10126* (2013.01); *H01L 2224/1147* (2013.01); *H01L 2224/11462* (2013.01); *H01L 2224/11849* (2013.01); *H01L 2224/13* (2013.01); *H01L 2224/131* (2013.01); *H01L 2224/13006* (2013.01); *H01L 2224/13022* (2013.01); *H01L 2224/13024* (2013.01); *H01L 2924/00014* (2013.01); *H01L 2924/01022* (2013.01); *H01L 2924/01023* (2013.01); *H01L 2924/01028* (2013.01); *H01L 2924/01029* (2013.01); *H01L 2924/05042* (2013.01); *H01L 2924/05442* (2013.01); *H01L 2924/06* (2013.01); *H01L 2924/07025* (2013.01); *H01L 2924/2064* (2013.01); *H01L 2924/37001* (2013.01)

(56) References Cited

U.S. PATENT DOCUMENTS

2006/0246706 A1* 11/2006 Ke .......................... H01L 24/11 438/613
2008/0230877 A1 9/2008 Chung et al.
2009/0015285 A1 1/2009 Farooq et al.
2009/0057892 A1 3/2009 Osumi

* cited by examiner

FABRICATION METHOD OF PACKAGING SUBSTRATE

CROSS-REFERENCE TO RELATED APPLICATION(S)

This application is a divisional of copending application U.S. Ser. No. 13/482,313, filed on May 29, 2012, which claims under 35 U.S.C. § 119(a) the benefit of Taiwanese Patent Application No. 100140252, filed Nov. 4, 2011, the entire contents of which are incorporated herein by reference.

BACKGROUND OF THE INVENTION

1. Field of the Invention

The present invention relates to packaging substrates and fabrication methods thereof, and more particularly, to a packaging substrate for solder bumps to be formed thereon and a fabrication method thereof.

2. Description of Related Art

In a conventional flip-chip semiconductor package, a plurality of solder bumps are formed on the conductive pads of a semiconductor chip and electrically connected to a packaging substrate so as to electrically connect the semiconductor chip to the packaging substrate. Compared with wire bonding, the flip-chip technology provides shorter electrical path and better electrical performance. Further, the inactive surface of the semiconductor chip can be exposed from the package structure so as to improve the heat dissipating efficiency.

FIG. 1 is a schematic cross-sectional view showing a packaging substrate having a UBM (under bump metallurgy) layer as disclosed by U.S. Pat. No. 5,937,320. Referring to FIG. 1, a titanium layer 11$a$ and a copper layer 11$b$ are formed on the conductive pads 101 of a semiconductor chip 10 first and then solder bumps 12 are formed on the copper layer 11$b$ corresponding in position to the conductive pads 101. Thereafter, portions of the titanium layer 11$a$ and the copper layer 11$b$ that are uncovered by the solder bumps 12 are removed by etching so as to define a UBM layer 11 under each of the solder bumps 12. As such, the solder bumps 12 are securely attached to the conductive pads 101 of the semiconductor chip 10 through the UBM layer 11.

However, during the etching process, since the titanium layer 11$a$ is etched faster than the copper layer 11$b$, it results in serious side-etching of the titanium layer 11$a$. As such, a significant undercut structure is formed as shown in FIG. 1. The undercut structure induces stress concentration such that the overall solder bump structure easily cracks at the stress concentration point, thereby reducing the product reliability.

Therefore, there is a need to provide a packaging substrate and a fabrication method thereof such that the significant undercut structure caused by serious side-etching of the UBM layer can be avoided so as to increase the product reliability and yield.

SUMMARY OF THE INVENTION

Accordingly, the present invention provides a packaging substrate, which comprises: a base body having at least a conductive pad on a surface thereof; a dielectric layer formed on the surface of the base body and having at least a first opening for exposing the at least a conductive pad and at least a second opening formed at a periphery of the at least of a first opening; and a metal layer formed on the at least a conductive pad and the dielectric layer and extending to a sidewall of the at east a second opening.

Further, the packaging substrate can comprise at least a solder bump formed on the metal layer.

The present invention further provides a fabrication method of a packaging substrate, which comprises: providing a base body having at least a conductive pad on a surface thereof and forming a dielectric layer on the surface of the base body and at least a first opening in the dielectric layer for exposing the at least a conductive pad; forming at least a second opening in the dielectric layer around a periphery of the at least a first opening; forming a metal layer on the dielectric layer and the at least a conductive pad such that the metal layer extends to a sidewall of the at least a second opening; and forming at least a solder bump on the metal layer.

According to the present invention, the metal layer has an outer periphery corresponding in position to a sidewall of the at least a second opening, i.e., the outer periphery of the metal layer extends downward along the sidewall of the at least a second opening. Since it is not easy for an etch solution to flow upward to etch the metal layer, the present invention significantly eliminate side-etching of the metal layer and avoids an undesired undercut structure from occurrence, thereby improving the reliability of the thus-obtained product.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "one", "on", "top", "bottom" etc. are merely for illustrative purpose and should not be construed to limit the scope of the present invention.

FIGS. 2A to 2F are schematic cross-sectional views showing a packaging substrate and a fabrication method thereof according to the present invention. Therein, FIG. 2F' shows another embodiment of FIG. 2F.

Figure 1:
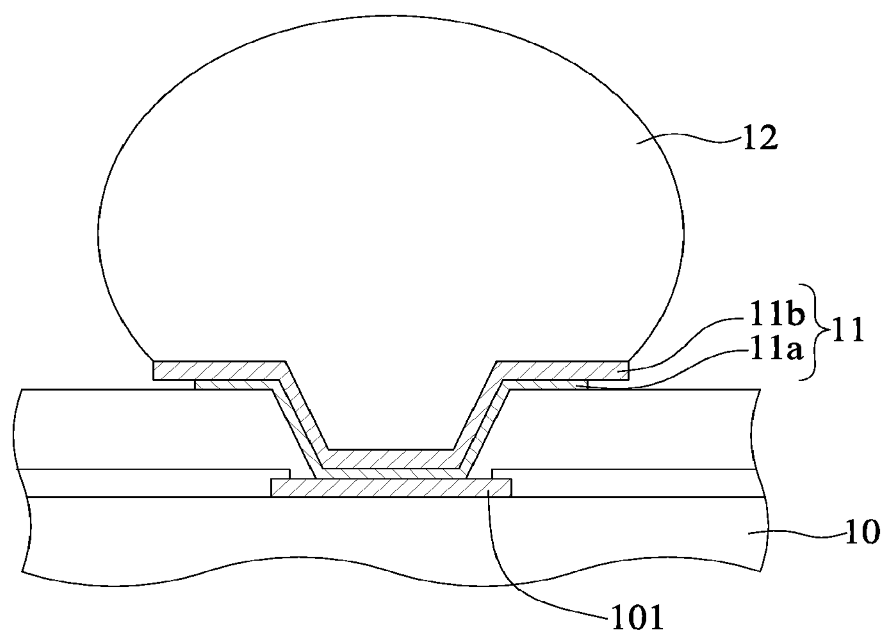
FIG. 1 is a schematic cross-sectional view showing a conventional packaging substrate having a UBM layer.
Figure 2A:
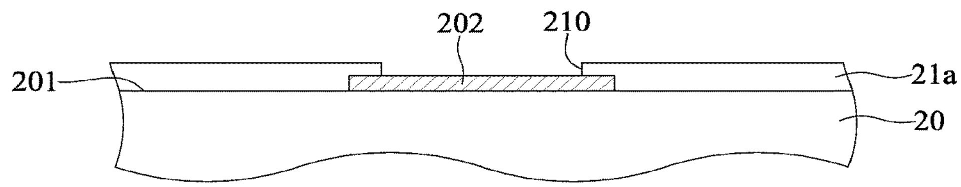
FIGS. 2A to 2F are schematic cross-sectional views showing a packaging substrate and a fabrication method thereof according to the present invention, wherein FIG. 2F' shows another embodiment of FIG. 2F.

Referring to FIG. 2A, a base body 20 having a plurality of conductive pads 202 on a surface 201 of the base body 20 is provided. A first sub-dielectric layer 21$a$ is formed on the surface 201 of the base body 20 and has a plurality of openings 210 formed therein for exposing the conductive pads 202, respectively. In the present embodiment, the base body 20 is a semiconductor wafer. The first sub-dielectric layer 21$a$ is a passivating protection layer for protecting the surface of the semiconductor wafer from undesired contact with air. The first sub-dielectric layer 21$a$ can be made of, but not limited to, SiN or SiOx.

Figure 2B:
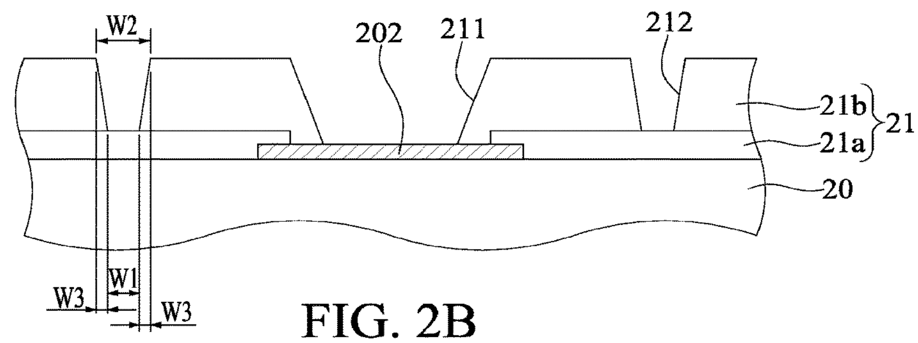

Referring to FIG. 2B, a second sub-dielectric layer 21$b$ is formed on the conductive pads 202 and the first sub-dielectric layer 21*a*. In the present embodiment, the second sub-dielectric layer 21*b* has a thickness greater than 10 um. The second sub-dielectric layer 21*b* further has a plurality of first openings 211 each having a wide top and a narrow bottom, and a plurality of ring-shaped second openings 212 formed around peripheries of the first openings 211. The first openings 211 are allowed to expose the conductive pads 202, respectively, and the second openings 212 are allowed to expose a portion of the first sub-dielectric layer 21*a*. The second sub-dielectric layer 21*b* can be made of polyimide (PI) or bis-Benzo-Cyclo-Butene (BCB). A bottom width W1 of each of the second openings 212 is equal to or larger than 10 um and a top width W2 of each of the second openings 212 is equal to or larger than 20 um, that is, a bevel edge of the second opening 212 has a horizontally projected width W3 of about 5 um. But it should be noted that the present invention is not limited thereto.

Figure 2C:
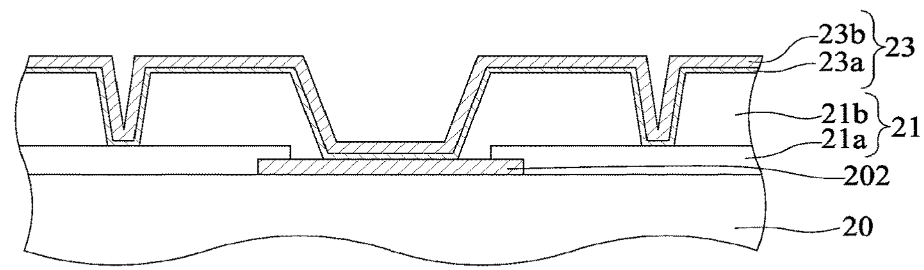

In addition, a dielectric layer 21 instead of the first and second sub-dielectric layers 21*a*, 21*b* can be formed in accordance with the present invention, and the second openings 212 can have other shapes in addition to a ring shape. Referring to FIG. 2C, a metal layer 23 is formed on the second sub-dielectric layer 21*b*, the conductive pads 202 and the first sub-dielectric layer 21*a*. The metal layer 23 is multilayered and can be made of Ti/Cu, i.e., the metal layer 23 can sequentially have a titanium layer 23*a* and a copper layer 23*b* stacked on the titanium layer 23*a*. But it should be noted that the present invention is not limited thereto.

Figure 2D:
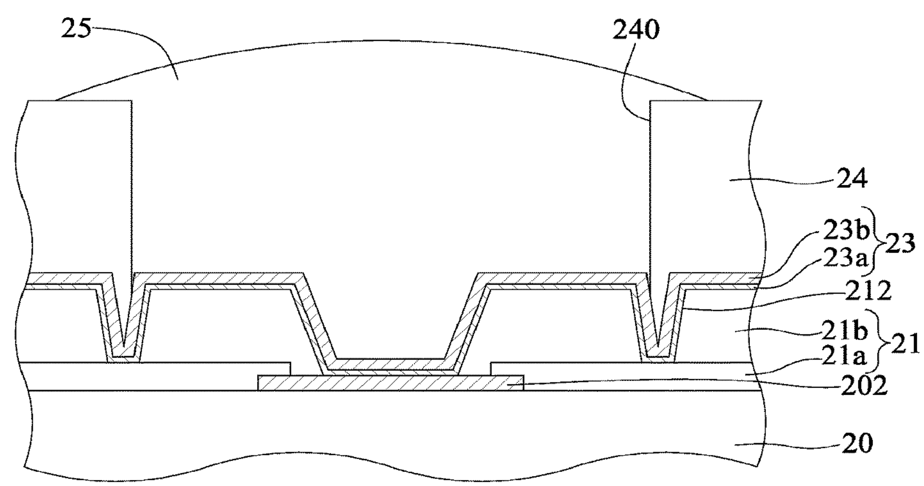

Referring to FIG. 2D, a resist layer 24 is formed on the metal layer 23 and has a plurality of openings 240 corresponding in position to the conductive pads 202, respectively. Therein, the walls of the openings 240 are located on the sidewalls of the second openings 212 close to the first openings 211. Then, solder bumps 25 are formed on the metal layer 23 in the openings 240 of the resist layer 24 by electroplating.

Figure 2E:
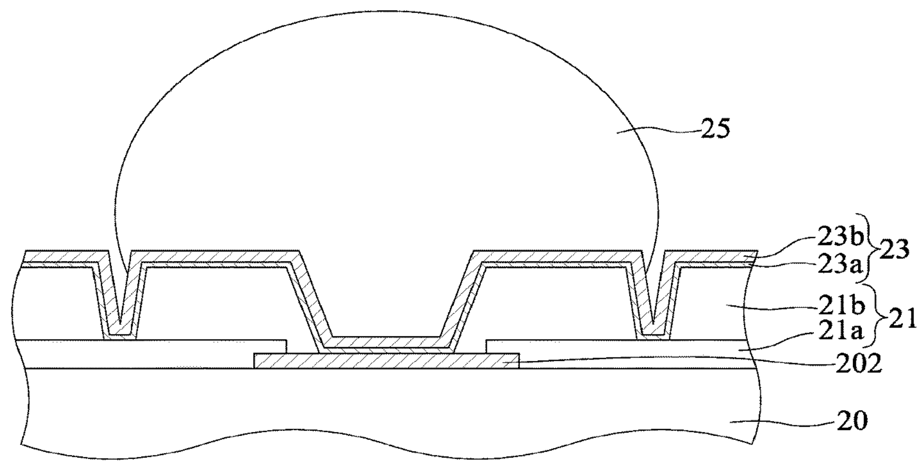

Referring to FIG. 2E, the resist layer 24 is removed and a reflow process can be performed.

Figure 2F:
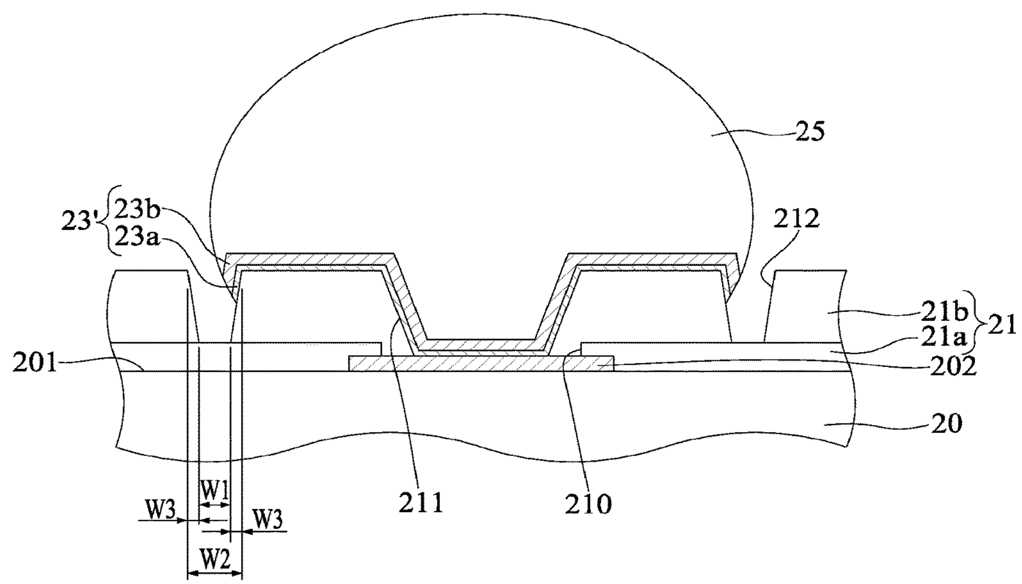
Figure 2F:
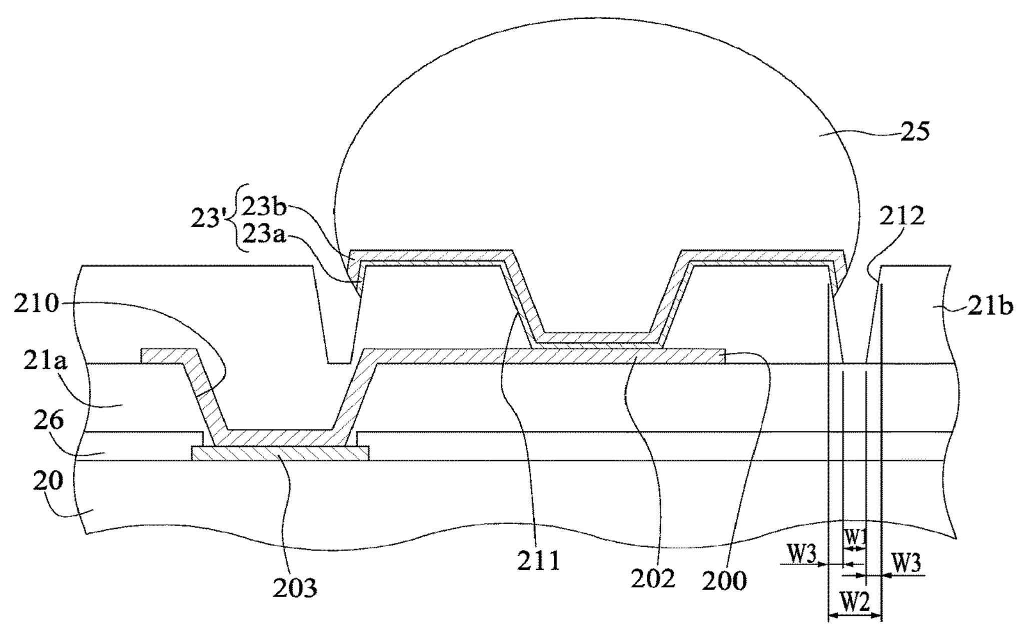

Referring to FIG. 2F, by using the solder bumps 25 as a mask, portions of the metal layer 23 that are uncovered by the solder bumps 25 are removed by etching such that a UBM layer 23' having a seagull-shaped cross section is defined under each of the solder bumps 25. The metal layer 23' covers the exposed portion of each of the conductive pads 202, the sidewall of each of the first openings 211, a portion of the second sub-dielectric layer 21*b* between the first opening 211 and the second opening 212, and a portion of or all of the sidewall of each of the second openings 212 proximate to a corresponding one of the first opening 211.

In another embodiment of the present invention, as shown in FIG. 2F', a base body 20 is provided with a plurality of conductive pads 203. A passivating protection layer 26 made of SiN or SiOx is formed on the base body 20 and has openings formed therein for exposing the conductive pads 203, respectively. A first sub-dielectric layer 21*a* made of PI or BCB is formed on the conductive pads 203 and the passivating protection layer 26, and a plurality of openings 210 are formed in the first sub-dielectric layer 21*a* for exposing the conductive pads 203, respectively. Thereafter, a metal layer (not shown) is formed in the openings 210 of the first sub-dielectric layer 21*a* and on the conductive pads 203. Particularly, a conductive seed layer is formed by sputtering, and the metal layer is formed on the conductive seed layer through electroplating and then patterned so as to form a redistribution layer 200. The redistribution layer 200 can be made of Ti/Cu, Ti/Cu/Ni or Ti/NiV/Cu. The redistribution layer 200 electrically connects the conductive pads 203 and has a plurality of conductive pads 202 extending therefrom so as to increase the circuit layout flexibility. Further, a second sub-dielectric layer 21*b* is formed on the redistribution layer 200. The second sub-dielectric layer 21*b* can be made of, but not limited to, PI or BCB. Similarly, the second sub-dielectric layer 21*b* has a plurality of first openings 211 formed corresponding in position to the conductive pads 202 so as to expose portions of the conductive pads 202. In the present embodiment, the second sub-dielectric layer 21*b* has a thickness greater than 10 um. A plurality of first openings 211 each having a wide top and a narrow bottom and a plurality of ring-shaped second openings 212 are formed in the second sub-dielectric layer 21*b*. The first openings 211 expose the conductive pads 202, respectively. The second openings 212 are formed around peripheries of the first openings 211 for exposing portions of the first sub-dielectric layer 21*a*. A bottom width W1 of each of the second openings 212 is equal to or larger than 10 um and a top width W2 of each of the second openings 212 is equal to or larger than 20 um, that is, a bevel edge of the second opening 212 has a horizontally projected width W3 of about 5 um. But it should be noted that the present invention is not limited thereto. Thereafter, a metal layer 23' is formed on each of the conductive pads 202 so as to cover the exposed portion of the conductive pad 202, the sidewall of the first opening 211, a portion of the second sub-dielectric layer 21*b* between the first opening 211 and the second opening 212, and the sidewall of the second opening 212. The metal layer 23' can be made of Ti/Cu, i.e., the metal layer 23' can sequentially have a titanium layer 23*a* and a copper layer 23*b* stacked on the titanium layer 23*a*. But it should be noted that the present invention is not limited thereto. Further, a solder bump 25 is formed on the metal layer 23'. In the present embodiment, the solder bump 25 is made of a lead-free solder material and reflowed to cover the conductive pad 202 and the metal layer 23', thereby defining a UBM layer 23' having a seagull-shaped cross-section under the solder bump 25.

The present invention further provides a packaging substrate, which has: a base body 20 having a conductive pads 202 on a surface 201; a dielectric layer 21 formed on the surface 201 of the base body 20 and having a plurality of first openings 211 for exposing the conductive pad 202 and a second plurality of openings 212 formed around a periphery of each of the first openings 211; and a metal layer 23' formed on the conductive pads 202 and the dielectric layer 21 around the conductive pads 202 and extending to a sidewall of each of the second opening 212.

The packaging substrate further has a plurality of solder bumps 25 disposed on the metal layer 23'.

In the above-described packaging substrate, the second openings 212 each are formed around the periphery of a corresponding one of the first opening 211. The metal layer 23' continuously covers the conductive pads 202, the sidewall of each of the first openings 211, a portion of the dielectric layer 21 between the first openings 211 and the second openings 212, and the sidewall of each of the second openings 212.

In the present embodiment, the first opening 211 has a circular shape and the second opening 212 has a ring shape. The first opening 211 and the second opening 212 are concentric. Further, the dielectric layer 21 has a first sub-dielectric layer 21*a* formed on the surface 201 of the base body 20 and a second sub-dielectric layer 21*b* formed on the first sub-dielectric layer 21*a* and having the first openings 211 and the second openings 212. The second openings 21 expose a portion of the first sub-dielectric layer 21*a*.

The base body 20 can be a semiconductor wafer. The first sub-dielectric layer 21*a* can be made of SiN. The second sub-dielectric layer 21*b* can be made of PI or BCB.

A bottom width of the second opening 212 is equal to or larger than 10 um, and a top width W2 of the second opening 212 is equal to or larger than 20 um.

The second opening 212 has a wide top and a narrow bottom. The UBM layer 23' is made of Ti/Cu.

The packaging substrate can have a UBM layer. Further, the packaging substrate can be mounted to another packaging substrate in a flip-chip manner or applied to a wafer level chip scale package (WLCSP).

According to the present invention, the metal layer has an outer periphery corresponding in position to an inner sidewall of the second opening. Since it is not easy for an etch solution to flow upward to etch the metal layer, the present invention significantly suppresses side-etching of the metal layer and avoids an undesired undercut structure, thereby improving the reliability of the overall structure.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A fabrication method of a packaging substrate, comprising:

providing a base body having at least a conductive pad on a surface thereof and a dielectric layer formed on the surface of the base body and at least a first opening formed in the dielectric layer for exposing the conductive pad;

forming at least a second opening in the dielectric layer around a periphery of the first opening, wherein the second opening is spaced apart from the first opening, and the second opening is free from being located directly above the conductive pad;

after forming the second opening in the dielectric layer around the periphery of the first opening, forming a metal layer on the dielectric layer and the conductive pad, allowing the metal layer to extend to only a part of a sidewall of the second opening without covering an entire surface of the second opening; and forming at least a solder bump on the metal layer.

2. The method of claim 1, wherein forming the at least a solder bump on the metal layer comprises:

forming a resist layer on the metal layer, wherein the resist layer has at least an opening corresponding in position to the conductive pad and the opening has a wall located on the sidewall of the second opening;

forming the solder bump on the metal layer in the opening of the resist layer;

removing the resist layer; and etching a portion of the metal layer uncovered by the at least a solder bump.

3. The method of claim 2, after removing the resist layer, further comprising reflowing the solder bump.

4. The method of claim 1, wherein the dielectric layer comprises a first sub-dielectric layer formed on the surface of the base body, and a second sub-dielectric layer formed on the first sub-dielectric layer and having the first opening and the second opening, wherein a portion of the first sub-dielectric layer is exposed from the second opening.

5. The method of claim 4, wherein the first sub-dielectric layer is made of SiN, and the second sub-dielectric layer is made of polyimide (PI) or bis-Benzo-Cyclo-Butene (BCB).

6. The method of claim 1, wherein a bottom width of the second opening is equal to or larger than 10 um.

7. The method of claim 1, wherein a top width of the second opening is equal to or larger than 20 um.

8. The method of claim 1, wherein the second opening has a wide top and a narrow bottom.

9. The method of claim 1, wherein the metal layer is multilayered and comprises Ti/Cu.

* * * * *